(12) United States Patent
Alvarez et al.

(10) Patent No.: US 11,682,573 B2
(45) Date of Patent: Jun. 20, 2023

(54) PELLICLE REMOVAL TOOL

(71) Applicant: PHOTRONICS, INC., Brookfield, CT (US)

(72) Inventors: Hilario Ar-Miguel Alvarez, Flower Mound, TX (US); Spencer Allen Mullens, Denison, TX (US); Jesse Eugene Williams, II, McKinney, TX (US)

(73) Assignee: PHOTRONICS, INC., Brookfield, CT (US)

( * ) Notice: Subject to any disclaimer, the term of this patent is extended or adjusted under 35 U.S.C. 154(b) by 1 day.

(21) Appl. No.: 17/390,018

(22) Filed: Jul. 30, 2021

(65) Prior Publication Data

US 2021/0384057 A1    Dec. 9, 2021

Related U.S. Application Data

(63) Continuation of application No. 15/960,963, filed on Apr. 24, 2018, now Pat. No. 11,183,410.

(Continued)

(51) Int. Cl.
| | |
|---|---|
| *G03F 1/64* | (2012.01) |
| *G03F 7/20* | (2006.01) |
| *H01L 21/68* | (2006.01) |
| *H01L 21/687* | (2006.01) |
| *G03F 7/00* | (2006.01) |
| *G03F 1/82* | (2012.01) |
| *H01L 21/683* | (2006.01) |
| *G03F 1/62* | (2012.01) |
| *B32B 38/10* | (2006.01) |

(52) U.S. Cl.
CPC ............ *H01L 21/68* (2013.01); *H01L 21/682* (2013.01); *H01L 21/68742* (2013.01); *B32B 38/10* (2013.01); *G03F 1/62* (2013.01); *G03F 1/64* (2013.01); *G03F 1/82* (2013.01); *G03F 7/70983* (2013.01); *H01L 21/683* (2013.01); *Y10T 156/1168* (2015.01)

(58) Field of Classification Search
CPC . H01L 21/68; H01L 21/682; H01L 21/68742; H01L 21/683; B32B 38/10; G03F 1/62; G03F 1/64; G03F 1/82; G03F 7/70983; Y10T 156/1168
USPC ................................ 430/5; 355/75; 156/714
See application file for complete search history.

(56) References Cited

U.S. PATENT DOCUMENTS

| | | |
|---|---|---|
| 5,816,568 A | 10/1998 | Fox |
| 5,953,107 A | 9/1999 | Li et al. |

(Continued)

FOREIGN PATENT DOCUMENTS

| | | | |
|---|---|---|---|
| JP | 2006-301525 A | | 11/2006 |
| JP | 2006301525 A | * | 11/2006 |

(Continued)

*Primary Examiner* — Mahdi H Nejad
(74) *Attorney, Agent, or Firm* — Amster, Rothstein & Ebenstein LLP

(57) ABSTRACT

A pellicle removal tool including a stage that holds a photomask and an associated pellicle, two or more arms positioned around the stage and configured to engage pellicle side wells of the pellicle, and two or more actuators each configured to adjust at least a vertical position of a corresponding one of the two or more arms so as to apply a lifting force to the pellicle for removal of the pellicle from the photomask.

12 Claims, 10 Drawing Sheets

Related U.S. Application Data

(60) Provisional application No. 62/489,200, filed on Apr. 24, 2017.

(56) References Cited

U.S. PATENT DOCUMENTS

| | | | |
|---|---|---|---|
| 5,976,307 | A | 11/1999 | Cook, Jr. |
| 6,317,197 | B1 | 11/2001 | Li et al. |
| 8,226,795 | B2 | 7/2012 | Brass et al. |
| 10,409,154 | B2 | 9/2019 | Grenon et al. |
| 10,437,145 | B2 | 10/2019 | Choi et al. |
| 10,539,886 | B2 * | 1/2020 | Van Der Meulen ................ G03F 7/70825 |
| 11,183,410 | B2 * | 11/2021 | Alvarez ............... H01L 21/682 |
| 2004/0135986 | A1 * | 7/2004 | Lee .................... G03F 7/70983 355/75 |
| 2006/0098184 | A1 | 5/2006 | Shibazaki |
| 2006/0240199 | A1 | 10/2006 | Sekihara |
| 2008/0041429 | A1 | 2/2008 | Pan |
| 2009/0239156 | A1 | 9/2009 | Andritzke et al. |
| 2010/0078039 | A1 | 4/2010 | Wu et al. |
| 2012/0057140 | A1 * | 3/2012 | Aoki ....................... G03F 7/709 430/320 |
| 2015/0059987 | A1 | 3/2015 | Kumakura et al. |
| 2015/0318200 | A1 * | 11/2015 | Ohno ................... H01L 21/463 414/797 |
| 2016/0154299 | A1 * | 6/2016 | Choi ....................... G03F 1/64 430/5 |
| 2018/0088459 | A1 | 3/2018 | Tseng et al. |

FOREIGN PATENT DOCUMENTS

| | | |
|---|---|---|
| JP | 2007-298870 A | 11/2007 |
| JP | 2007298870 A * | 11/2007 |
| WO | 2003/007352 A1 | 1/2003 |

\* cited by examiner

LED Light switches for each respective side

PELLICLE REMOVAL TOOL

RELATED APPLICATIONS

This is a continuation application that claims priority to and the benefit of U.S. patent application Ser. No. 15/960,963, filed Apr. 24, 2018 and entitled PELLICLE REMOVAL TOOL, which, in turn, claims priority to and the benefit of U.S. Provisional Patent Application No. 62/489,200, filed Apr. 24, 2017 and entitled PELLICLE REMOVAL TOOL, the contents of all of which are incorporated herein by reference in their entirety.

FIELD OF THE INVENTION

The present disclosure generally relates to equipment and processes used in the manufacture of photomasks, and in particular relates to devices and methods for removing a pellicle from a photomask.

BACKGROUND OF THE INVENTION

Photomasks are high precision plates containing microscopic images of electronic circuits. Photomasks are typically made from very flat pieces of quartz or glass with a layer of chrome on one side. Etched in the chrome is a portion of an electronic circuit design. This circuit design on the mask is also called "geometry."

A photomask is often protected from particles by a pellicle, which is a thin transparent film stretched over a frame that is glued over one side of the photomask. The conventional technique for removing a pellicle from a photomask involves the use of a pry bar, and specifically requires an operator to rock the pry bar backwards to lift the frame off the photomask plate. This process must be repeated around the frame until the pellicle lifts off the plate surface on one side, and then the operator must manually remove the pellicle frame. The conventional pellicle removal technique has many disadvantages, including, for example: pellicle and plate are touched at corners; high risk of scratching or handling damage to the photomask; glue is sometimes left on the surface in large quantities; removal of glue string by hand or tool is risky; old dry glue can pose difficulties in removing frame by hand; the frame can fall back on the plate and re-stick; pull motion is an arc upwards and thus there is an eventual loss of grip on the frame; the tool requires a relatively high amount of arc range to lift the frame to a suitable height; and the tool arc has maximum penetration at rest point only and eventually rocks outward, to name a few.

What is needed is an improved way to remove pellicles without one or more of these disadvantages.

SUMMARY OF THE INVENTION

A pellicle removal tool according to an exemplary embodiment of the present invention comprises: a stage that holds a photomask and an associated pellicle; two or more arms positioned around the stage and configured to engage pellicle side wells of the pellicle; and two or more actuators each configured to adjust at least a vertical position of a corresponding one of the two or more arms so as to apply a lifting force to the pellicle for removal of the pellicle from the photomask.

In an exemplary embodiment, each of the two or more actuators comprise a first actuator that adjusts a vertical position of the corresponding arm and a second actuator that adjusts a lateral position of the corresponding arm.

In an exemplary embodiment, the two or more actuators comprise lead screws.

In an exemplary embodiment, each of the two or more arms comprise a pin configured for engagement with the pellicle side wells.

In an exemplary embodiment, the tool further comprises two or more columns, each of the two or more arms being housed within a corresponding one of the two or more columns.

In an exemplary embodiment, a position of each of the columns is adjustable.

In an exemplary embodiment, the two or more columns are mounted on linear motion bearings.

In an exemplary embodiment, the linear motion bearings comprise rails.

In an exemplary embodiment, the stage comprises a plate holder into which the photomask is inserted.

In an exemplary embodiment, the plate holder is removable from the tool.

In an exemplary embodiment, the plate holder comprises a clamp mechanism that secures the photomask within the plate holder.

In an exemplary embodiment, the clamp mechanism comprises an adjustable banking arm.

In an exemplary embodiment, the plate holder comprises at least one of tabs or ramps that flexibly engage the photomask.

BRIEF DESCRIPTION OF THE DRAWINGS

The above and related objects, features and advantages of the present invention will be more fully understood by reference to the following, detailed description of the preferred, albeit illustrative, embodiments of the present invention when taken in conjunction with the accompanying figures, wherein.

DETAILED DESCRIPTION OF THE INVENTION

The present disclosure generally relates to equipment and processes used in the manufacture of photomasks, and in particular relates to devices and methods for removing a pellicle from a photomask.

The present invention is directed to a tool used to remove a pellicle frame and glue from a photomask. The tool includes pulling arms that can be adjusted for insertion into a respective pellicle inlet well and for lifting of the pellicle frame. In exemplary embodiments, the tool includes individual columns (e.g., four columns) each including a pulling arm. Specifically, referring to FIG. 1, in accordance with exemplary embodiments, the columns are adjustable along rails in the X-direction and the pulling arms are adjustable in the Y- and Z-directions so that individual columns/pulling arms can be independently adjusted in three dimensions to adapt to any sized pellicle frame and to provide greater control over the adhesive tear and pellicle separation. For the purposes of the present description, the X- and Y-axis extend parallel to the top surface of the tool 1 (i.e., the surface on which the photomask lies), while the Z-axis extends perpendicular to this plane. The tool may further include a stage, generally designated by reference number 39 in FIG. 3, that, in accordance with an exemplary embodiment, includes a plate holder assembly that holds the mask secure in the jig during pellicle removal. In alternative embodiments, a heating element may be provided to heat the glass surface of the mask so as to assist in removal of the adhesive.

Although the present disclosure describes exemplary embodiments of the present invention as including a "column" and "arms", with the position of each column and arm being adjustable relative to the fixed photomask/pellicle held in the tool, it should be appreciated that the present invention is intended to encompass other suitable arrangements, positionings and actuations of components that generate an appropriate force for application to the pellicle so as to at least partially tear and/or remove the adhesive at the photomask-pellicle interface and/or at least partially remove the pellicle from the photomask. For example, the arms may be arranged in any manner around and/or adjacent to the photomask, and may be actuated and/or positioned with or without the use of corresponding columns using any suitable actuation mechanism, such as, for example, any suitable hydraulic, pneumatic, electromechanical and/or piezoelectric actuating mechanism, to name a few.

Figure 1:
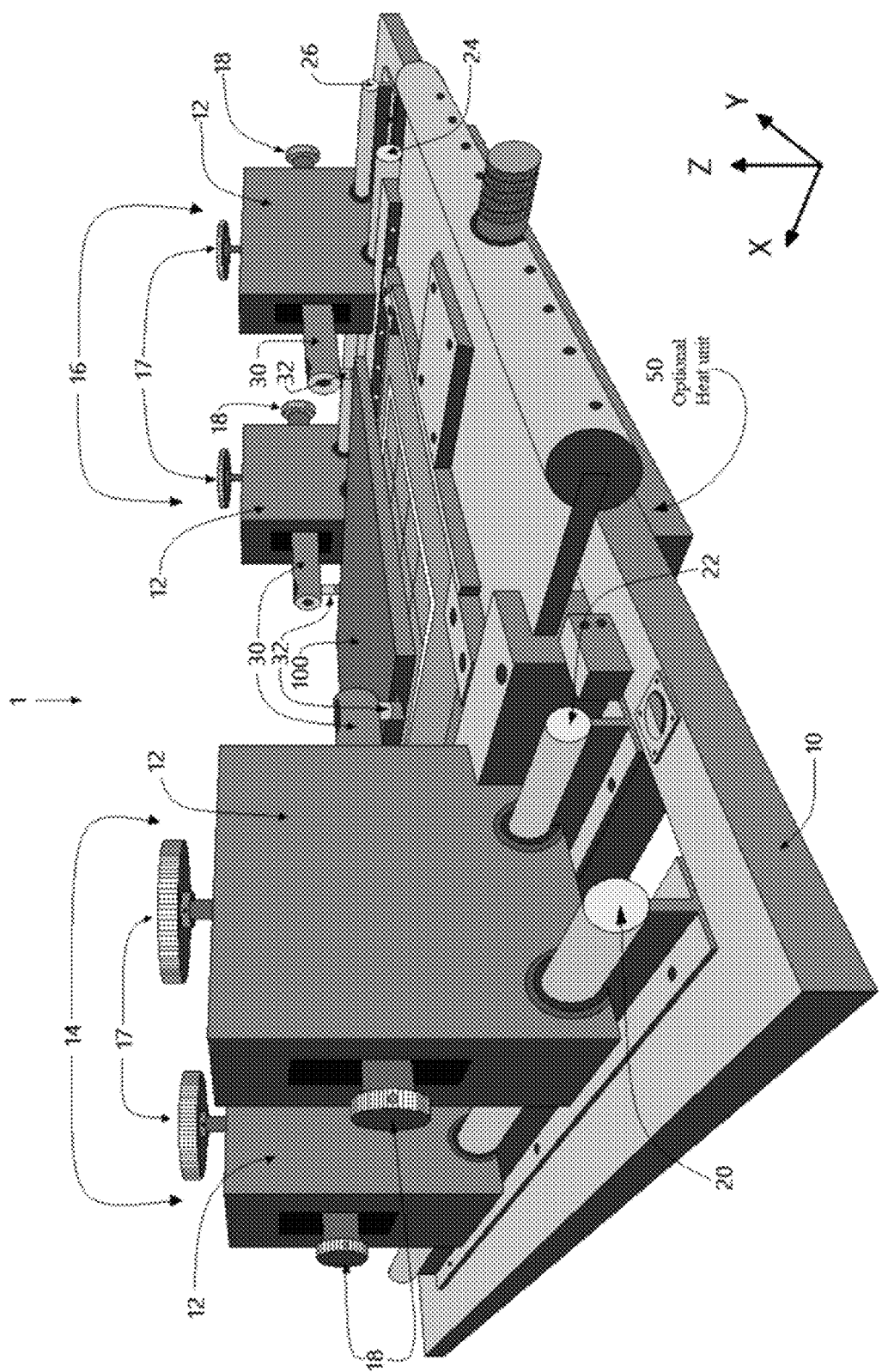
FIG. 1 is a view of a pellicle removal tool according to an exemplary embodiment of the present invention.

FIG. 1 is a perspective view of a pellicle removal tool, generally designated by reference number 1, according to an exemplary embodiment of the present invention. The tool 1 includes a frame 10 that generally surrounds and supports the various other components of the tool 1. The tool 1 further includes a number of columns 12 positioned around the sides of the frame 1. For example, as shown in FIG. 1, the columns 12 may be arranged in pairs, including a first pair 14 and a second pair 16, with the first pair 14 positioned at one side of the frame and the second pair 16 positioned at an opposite side of the frame 1. The columns 12 in each of the first and second pairs 14, 16 are positioned side by side in the X-direction, as shown in FIG. 1. Each pair 14, 16 of columns 12 is moveably mounted on corresponding linear-motion bearings so that the position of each column 12 can be independently adjusted along the X-direction. FIG. 1 shows the linear-motion bearings as cylindrical rails 20, 22, 24, 26, although it should be appreciated that the linear motion bearings may be or include any other suitable mechanisms, such as, for example, machine slides, XY tables, roller tables, dovetail slides and ball bearing slides, to name a few.

Figure 2A:
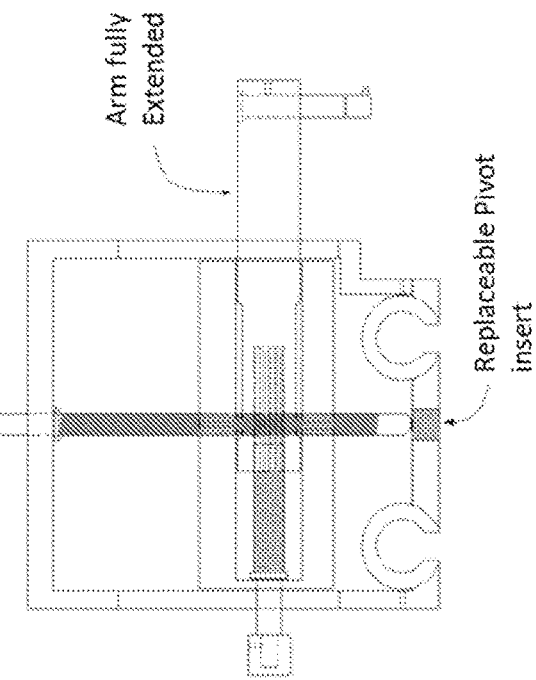
FIGS. 2A-2C are cross sectional views of a column and associated arm of a pellicle removal tool according to an exemplary embodiment of the present invention.
Figure 2B:
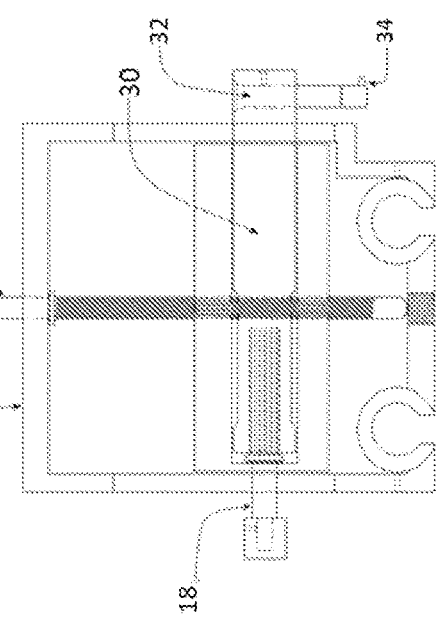
Figure 2C:
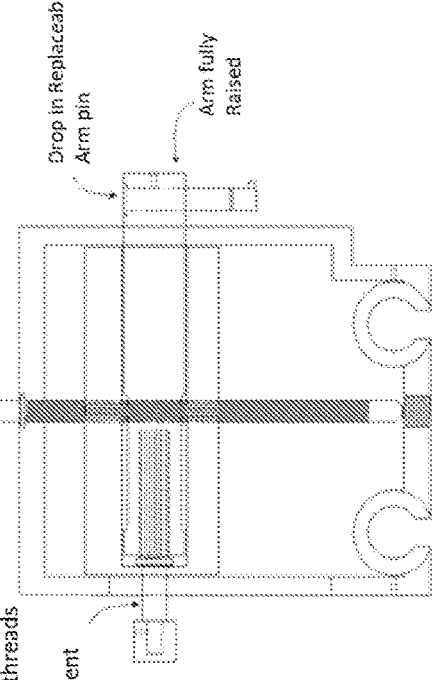

Each column 12 includes a corresponding arm 30 that is adjustable in both the Y-direction and the Z-direction, as shown in FIG. 1. Specifically, as shown in FIGS. 2A-2C, each column 12 includes a first lead screw 17 and a second lead screw 18, both of which extend through respective threaded openings in the corresponding arm 30. Rotation of the first lead screw 17 results in movement of the corresponding arm 30 in the Z-direction, while rotation of the second lead screw 18 results in movement of the corresponding arm 30 in the Y-direction. FIG. 2A shows the arm 30 in a lowered and retracted position, FIG. 2B shows the arm 30 in a lowered and fully extended position and FIG. 2C shows the arm 30 in a raised and retracted position. It should be appreciated that position of the arms 30 may be adjusted using any other appropriate mechanism, such as, for example, ball screws, roller screws, hydraulics, pneumatics, gear trains, electromagnetic actuators, and piezoelectric actuators, to name a few.

Each arm 30 may include an end portion 32 that extends downwards (i.e., along the Z-direction) for engagement with an inlet well of a pellicle. Specifically, the arm end portion 32 includes a pin 34 that can be slid into engagement with a respective pellicle inlet well by proper positioning of both the corresponding column 12 along the X-direction and the arm 30 along the Y- and Z-directions. Once each arm 30 is engaged with a respective pellicle inlet well, the arms 30 can be raised by actuation of the first lead screws 17, resulting in application of a lifting force to the pellicle and ultimately removal of the pellicle from the underlying photomask.

Figure 3:
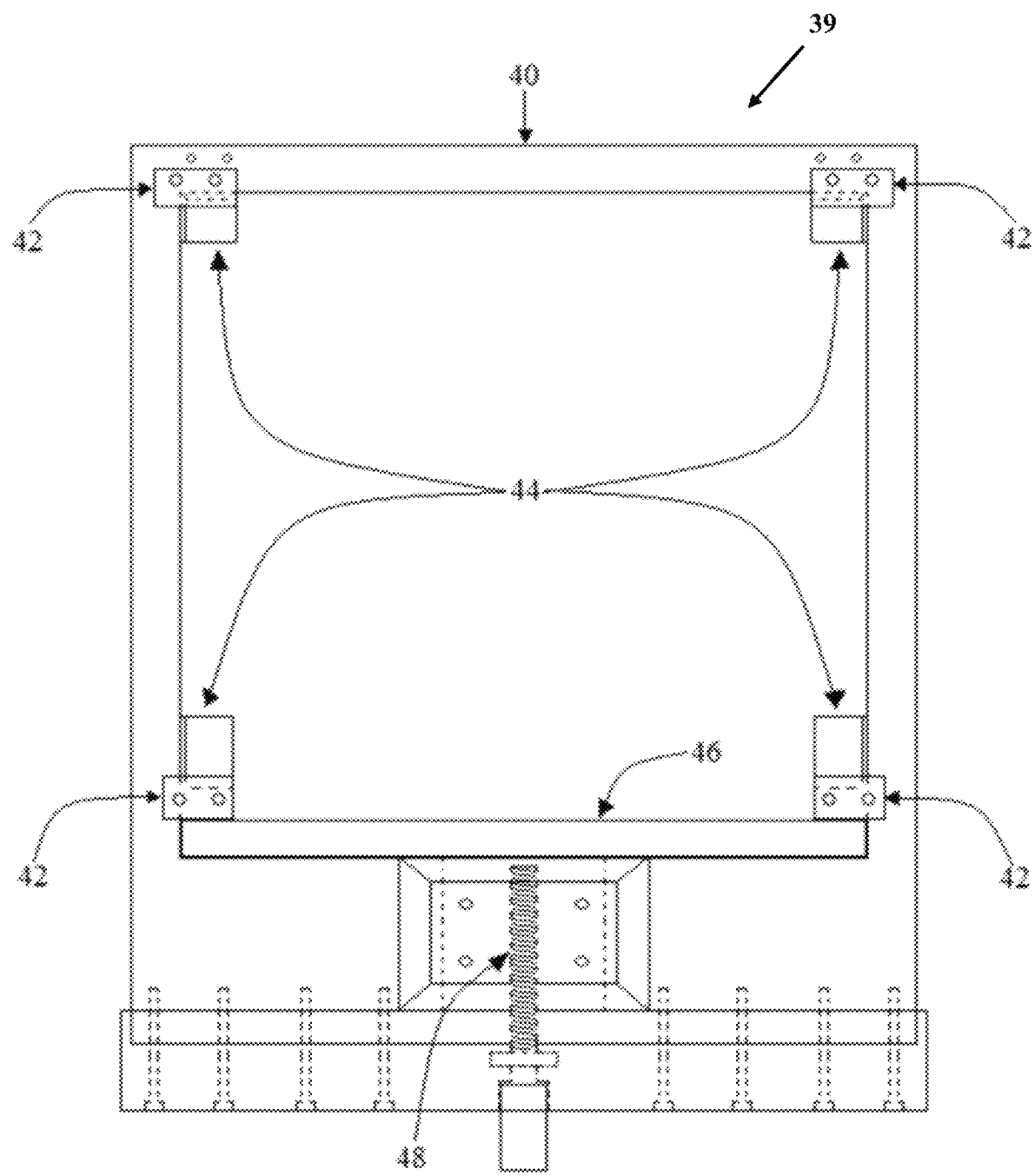
FIG. 3 is a planar view of a photomask plate holder according to an exemplary embodiment of the present invention.

According to exemplary embodiments, a photomask and associated pellicle (reference number 100 in FIG. 1) can be loaded into the tool 1 and held in a fixed position so as to provide the arms 30 access to the pellicle side wells. In this regard, as shown in FIG. 3, the tool 1 may include a plate holder 40 into which a photomask plate is inserted and clamped into position. The plate holder 40 may include a number of guiding elements, such as, for example, flexible tabs 42 and ramps 44 that hold the photomask in position within the plate holder 40 without causing damage to the photomask. In an exemplary embodiment, the guiding elements are made of a polymeric material, such as, for example, polyoxymethylene.

The plate holder 40 may further include a clamp mechanism that secures the photomask in position after being guided into the plate holder 40 via the guiding elements. As shown in FIG. 3, the clamp mechanism may include a banking arm 46 that is slid into engagement with the side of a photomask to clamp the photomask into position and out of engagement with the side of the photomask so that the photomask can be removed from the plate holder 40. The clamp mechanism may be manually controlled by, for example, an adjustable screw 48. In alternative embodiments, the clamp mechanism may be automatically controlled by, for example, electro-mechanical, hydraulic and/or pneumatic actuators.

According to an exemplary embodiment of the present invention, the tool 1 includes a heating element 50 that heats the photomask plate so as to loosen the adhesive between the plate and pellicle, thereby aiding in removal of the pellicle. The heating element 50 may be a thermoelectric device, such as, for example, a Peltier device. A fan or other cooling device may also be provided to assist in directing the heat towards the photomask plate and away from the other components of the tool 1. The heating element 50 may be regulated by a controller with an adjustable set point and current temperature readout. In an exemplary embodiment, the heating element 50 is a heating plate having dimensions of 7 in.×4 in, although it should be appreciated that the heating element 50 is not limited to this particular configuration and size.

Figure 4:
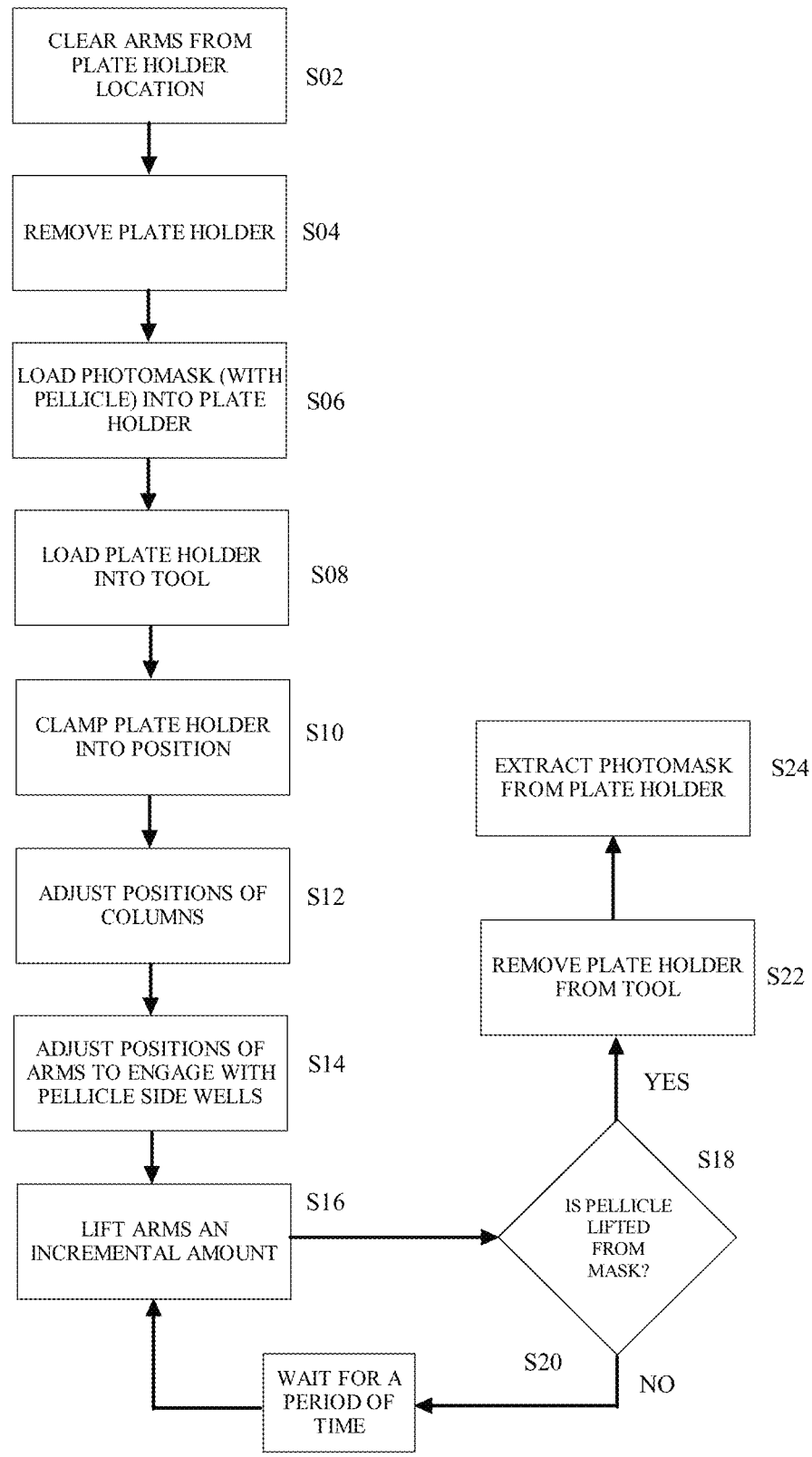
FIG. 4 is a flow chart showing a method for removing a pellicle from a photomask according to an exemplary embodiment of the present invention.

FIG. 4 is a flow chart showing operation of the tool 1 according to an exemplary embodiment of the present invention. Assuming the plate holder 40 is initially installed in the tool 1, the initial steps of the process involve clearing the columns 12 and arms 30 away from the plate holder 40 so that the plate holder 40 can be removed from the tool 1. Thus, in step S02, the first and second lead screws 17, 18 of the columns 12 may be adjusted to at least partially lower and retract the arms 30, and in an exemplary embodiment, the arms 30 are initially fully lowered and retracted. Then, in step S04, the plate holder 40 is removed from the tool 1, and in step S06, the photomask (with associated pellicle) is loaded into the plate holder 40. The loading of the photomask may be performed manually or may be performed using a handler.

In step S08, the plate holder 40 (with loaded photomask) is inserted into the tool 1 with the clamp mechanism initially at an at least partially or completely withdrawn position. Proceeding to step S10, the clamp mechanism is then adjusted to engage the plate holder 40 and thereby fix the photomask into position at a location within the tool 1 that is accessible by the arms 30.

In step S12, the positions of the columns 12 are adjusted along the X-direction so that the columns 12 are in close proximity to the pellicle inlet wells. In this regard, the columns 12 may be moved along the linear motion bearings (e.g., the cylindrical rails 20, 22, 24, 26), to thereby provide a rough X-axis position alignment for the arms 30 relative to the pellicle. In step S14, finer Y- and Z-axis position adjustments may be made using the lead screws 17, 18 to position the pins 34 of the arms 30 into engagement with the pellicle inlet wells. It should be appreciated that the rough and fine adjustments made in steps S12 and S14 are not limited to any particular sequence, and in exemplary embodiments rough X-axis position adjustments of the arms 30 using the columns 12 may be made after finer Y- and Z-axis position adjustments using the leads screws 17, 18. Alternatively, depending on the arrangement of actuators and arms, rough and fine position adjustments may be made along any of the X-, Y- and Z-axis.

In step S16, the first lead screws 17 are actuated so that the arms 30 exert a lifting force to the pellicle. In an exemplary embodiment, the arms 30 may be lifted incrementally by waiting a period of time between each adjustment of the lead screws 17. For example, as shown in step S18, after the arms are lifted an incremental amount, a determination is made as to whether the pellicle is lifted from the photomask. If not, the process may involve delaying the next lifting increment for a period of time (step S20). In this regard, the process may involve lifting of the arms 30 in fixed or varied increments, with fixed or variable time delays between each increment. For example, the user may wait a period of seconds, minutes or hours between each lift increment. The time delay is intended to avoid warping or other types of damage to the photomask that might otherwise occur with a rapid and/or uncontrolled lifting of the pellicle off the photomask.

Further, in regards to step S16, the arms 30 may be lifted in a sequential order so as to achieve a more controlled removal of the pellicle from the photomask. For example, the arms 30 may be lifted in sequence starting from a first one of the arms 30 to achieve an initial adhesive tear, followed by lifting of the remaining arms 30 around the pellicle in a clockwise or counter-clockwise order until a complete adhesive removal is achieved. This allows the user to track the adhesive tear location and progression and to ensure the bond between the pellicle frame and plate is fully separated before complete removal of the pellicle. In this regard, the tool 1 may be provided with one or more lighting elements, such as, for example, a plurality of LED lights located in proximity to the photomask mounting stage, so as to improve visibility of the photomask-pellicle interface.

After removal of the pellicle, the method proceeds to step S22, where the plate holder 40 is removed from the tool 1. This step may involve retraction of the clamp mechanism and manual lifting of the plate holder from the tool 1. In step S24, the photomask with the pellicle removed is then extracted from the plate holder either manually or with a mask handler.

After removal of the pellicle, there may be some residual glue remaining on the photomask plate. This can happen with plates that have an extreme stepping history or where the glue has been compromised by some other external factor. In order to remove the residual glue, a tool may be used that includes a stick with an expanded end and a ball of glue on the expanded end. Such a tool may be used to manually create a stringer of glue that allows for further pulling and removal of the residual glue.

The following example illustrates the uses and advantages of the present invention.

EXAMPLE 1.0 PURPOSE
1.1 In this Example, the pellicle membrane was removed from a 6" photomask using a pellicle removal tool according to an exemplary embodiment of the present invention.
2.0 APPLICATION/SCOPE
2.1 This Example is applicable to all 6" 4× and 5× photomasks requiring removal of a standard 6" type pellicle.
3.0 RESPONSIBILITY
3.1 Certified Manufacturing Operator
3.2 Engineering
4.0 EQUIPMENT
4.1 Pellicle removal tool
4.2 Glue Ball 1 (GB1) stringer remover tool
4.3 6" handler
4.4 ESD-safe Tweezers
5.0 MATERIALS
5.1 Photomask
5.2 Mask handler
5.3 Pre-saturated IPA wipe
6.0 DEFINITIONS
6.1 Pellicle inlet wells—The small partial holes on the long sides of all normal 6" pellicle frames that are used to assist in the removal of the pellicle.
6.2 Stringer—Small residual glue string that may exist between the underside of the pellicle frame and the plate surface that it was adhered to.
7.0 SAFETY
7.1 Direct contact with IPA on skin was avoided and safety glasses were worn when handling wipes.
8.0 ENVIRONMENTAL—N/A
9.0 SECURITY—N/A
10.0 EQUIPMENT SETUP
10.1 Prior to using equipment, locations of special interest that come in contact with the photomask were wiped down with an IPA pre-saturated wipe.
   10.1.1 Locations of special interest:
      10.1.1.1 The loading cassette that the mask will be seated on
      10.1.1.2 The cassette holder
      10.1.1.3 The arm pin locations 10.1.1.4 The "up/down" and "in/out" knobs on the pellicle removal tool 10.1.1.5 The slide column holding the up/down and in/out knobs 10.1.1.6 The slide rails 10.1.1.7 The inlets that the cassette is inserted into 10.1.1.8 Table that pellicle removal tool sits on 10.1.2 All areas were allowed at least 3 minutes to dry before using. The pellicle removal tool was not used if IPA was visibly present.

11.0 PROCEDURE 11.1 Loading the Tool 11.1.1 The photomask to be pulled was set in its box next to the side of the puller.

Figure 5:
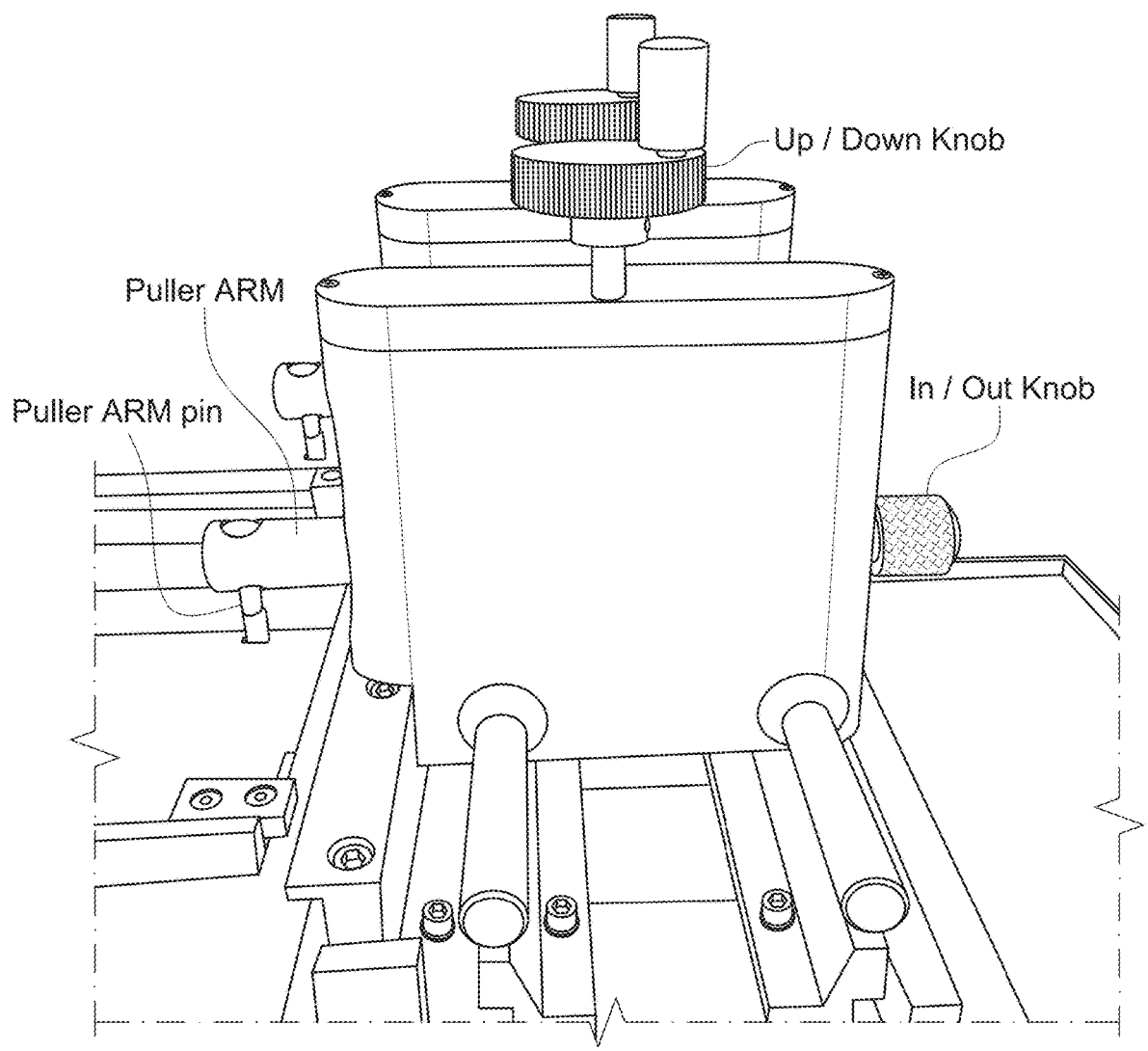
FIG. 5 shows a pellicle removal tool during a sequence of a method of removing a pellicle according to an exemplary embodiment of the present invention.

11.1.2 The "up/down" knobs were exercised on all 4 columns to move the puller arms upwards until they stop (FIG. 5).

Figure 6:
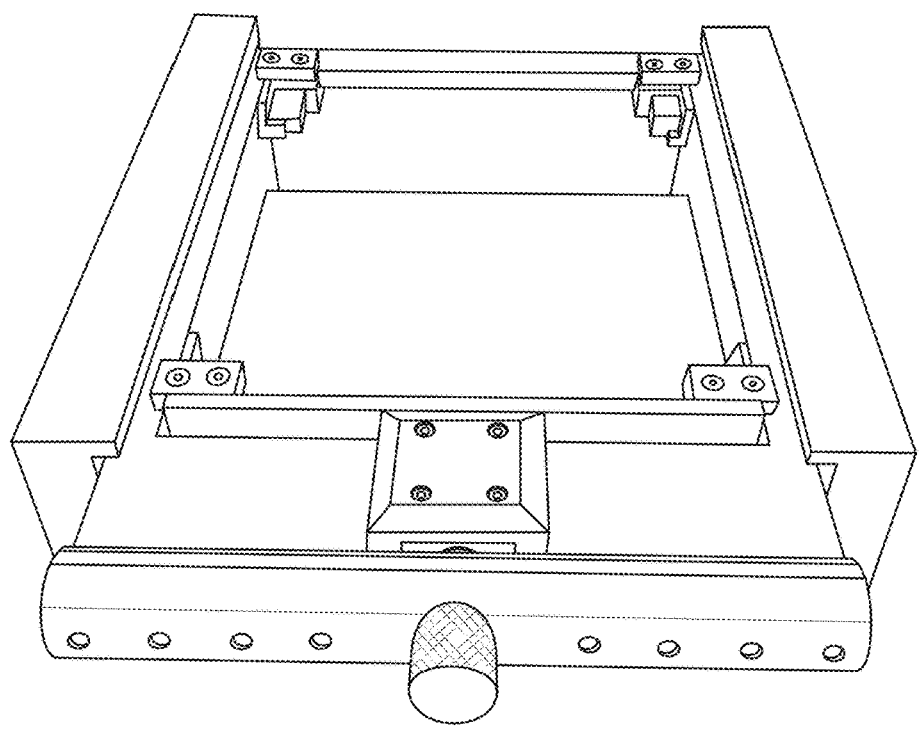
FIG. 6 shows a cassette holder during a sequence of a method of removing a pellicle according to an exemplary embodiment of the present invention.

11.1.3 The plate holder cassette was removed and placed in the cassette holder (FIG. 6). If the cassette was already in the holder, this step could have been skipped, but in any event it was confirmed that the arms on the pellicle removal tool were retracted and at their upmost position.

11.1.4 The photomask box was oriented such that the pellicle side was facing upwards. The box was opened and a mask handler was used to grab the plate on the ends that do not have pellicle inlet wells.

Figure 7:
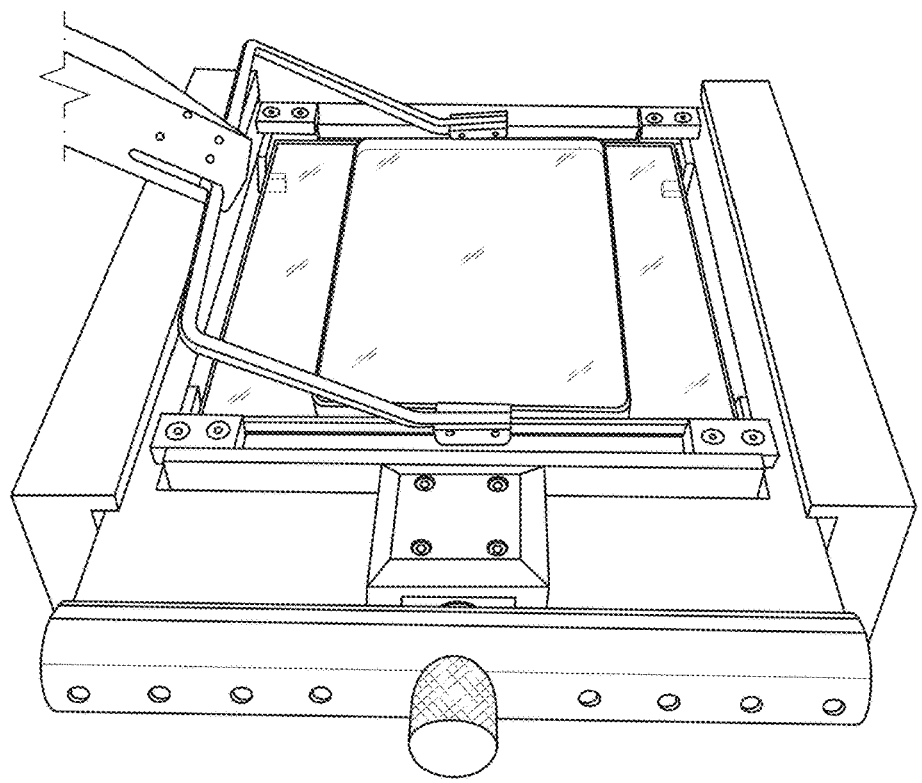
FIG. 7 shows a cassette holder during a sequence of a method of removing a pellicle according to an exemplary embodiment of the present invention.

11.1.5 The mask pellicle was placed side up in the cassette plate holder (FIG. 7). The long sides of the pellicle were oriented vertically.

11.1.6 The chrome knob on the back of the cassette was turned until the plate was locked in place. It only needed to be snug and not overly tightened.

Figure 8:
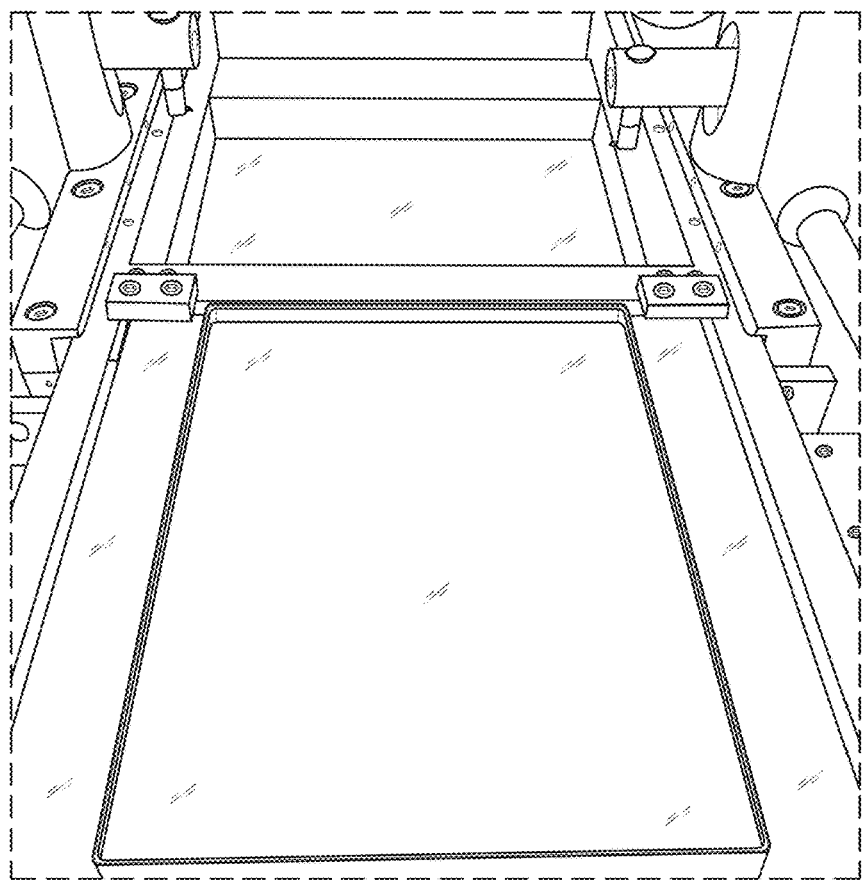
FIGS. 8-14 show a pellicle removal tool during sequences of a method of removing a pellicle according to an exemplary embodiment of the present invention.

11.1.7 The cassette was removed and placed in the center slot on the pellicle removal tool (FIG. 8).

11.2 Aligning the Puller Arms 11.2.1 Each column was moved close to its respective pellicle inlet well.

Figure 9:
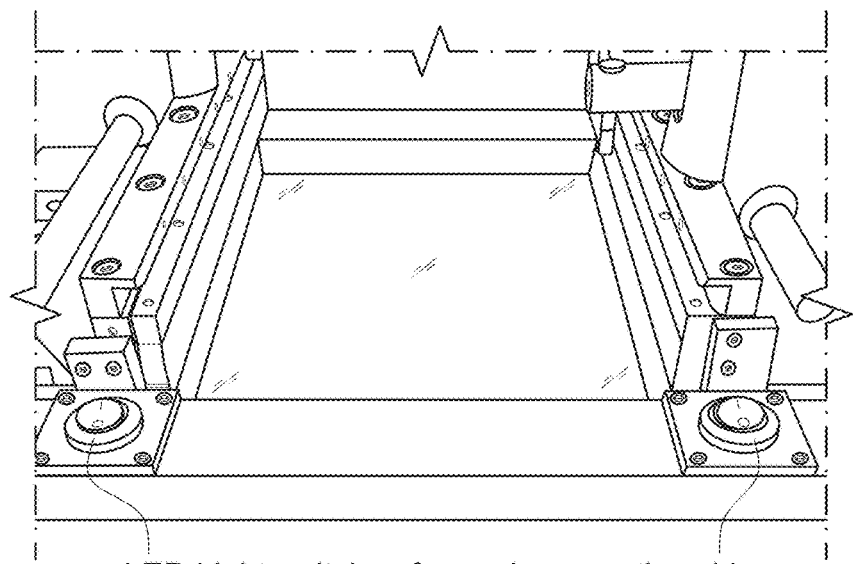
Figure 10:
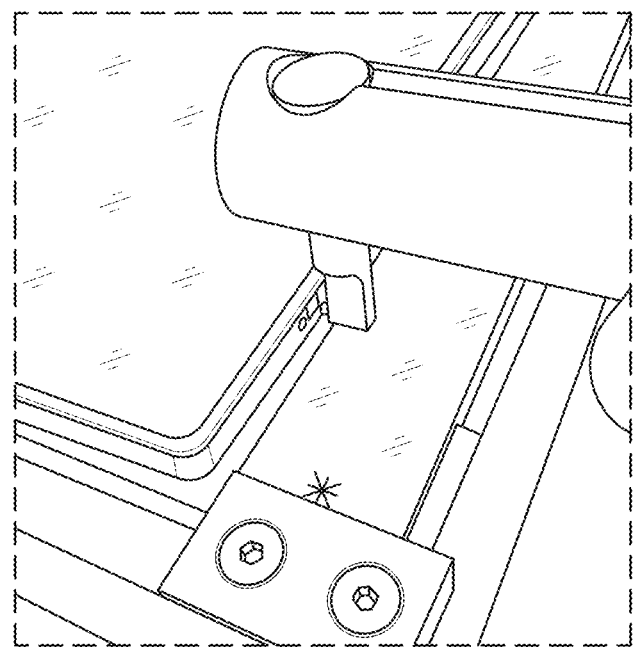
Figure 11:
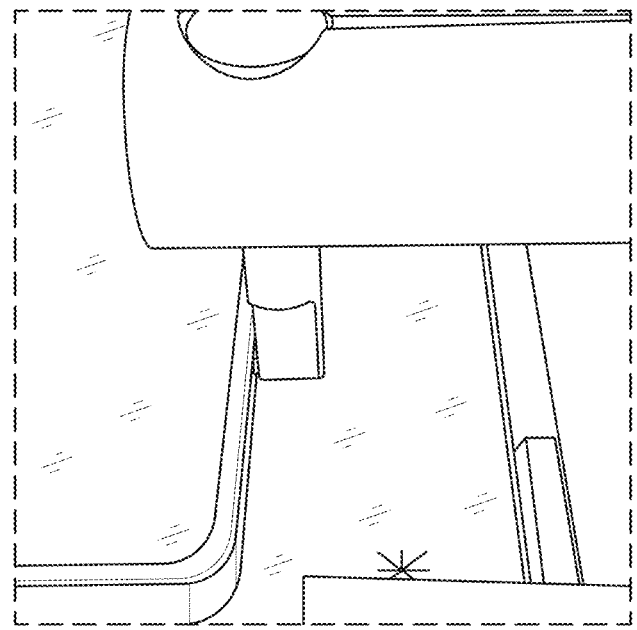

11.2.2 The LED lighting was turned on for the side being worked on (FIG. 9) and the puller arm was lowered with the "up/down" knob on the top of the column until the puller arm pin was aligned with the pellicle inlet well (FIG. 10). Then the "in/out" knob on the back of the column was turned to move the puller arm's pin into the pellicle inlet well (FIG. 11). Once correctly inserted, the pin disappeared into the pellicle inlet well. The puller arm was not over extended to avoid application of excessive force on the side of the pellicle and damage to the plate. The LED lighting was turned off after both locations on one side were aligned. The LED lighting on the oppose side was then turned on and the same alignment for the arms was performed.

11.3 Removing the Pellicle from the Surface of the Photomask 11.3.1 Both sides of the LED lighting were turned on.

11.3.2 The lower right "up/down" knob on the pellicle removal tool was turned such that it raised the puller arm and pellicle frame.

Figure 12:
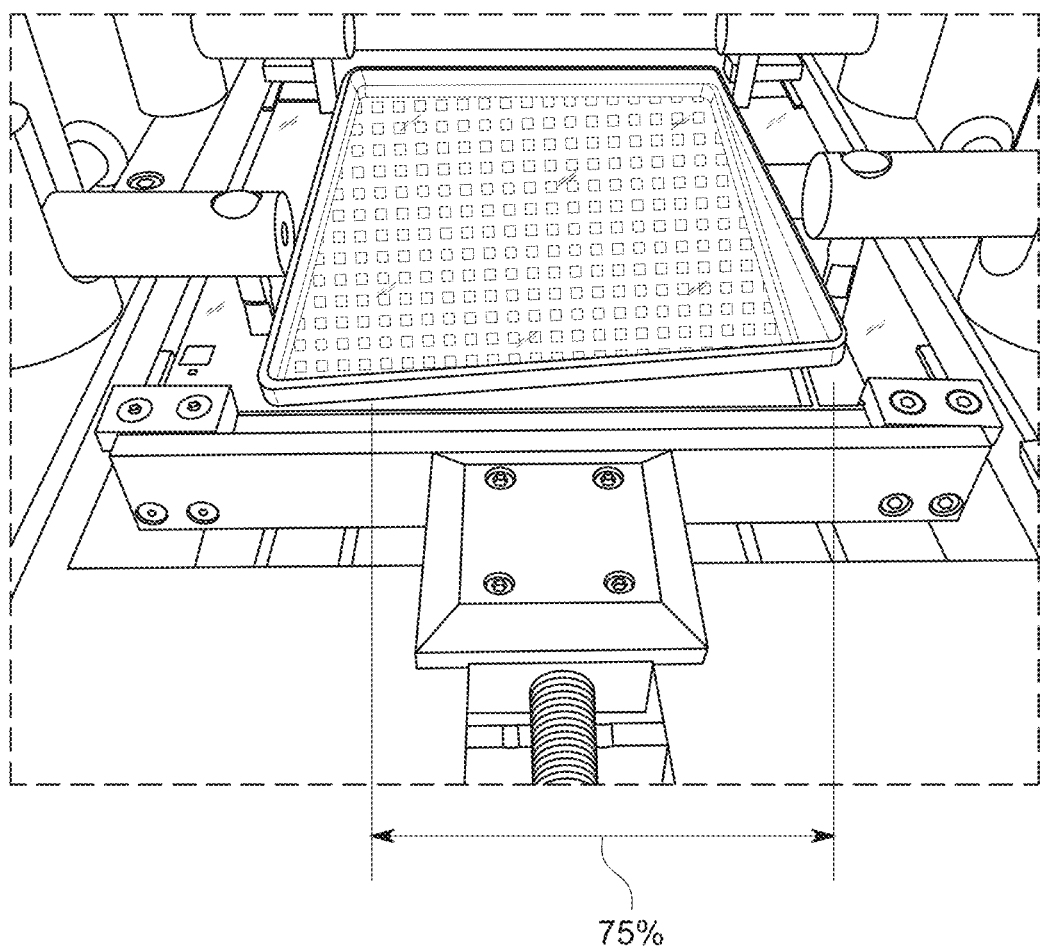

11.3.3 Once start of glue adhesion tear was observed, raising of the puller arm was continued until the tear moved approximately 75% of the distance across to the opposite corner on the lower left side of the frame, then turning of the knob was stopped (FIG. 12).

11.3.4 The lower left "up/down" knob on the pellicle removal tool was turned such that it raised the puller arm and continued to drive the adhesive tear around the perimeter of the pellicle frame on the left side. The knob was turned until the tear was driven approximately 75% the way to the upper left corner of the pellicle frame, then turning stopped.

Figure 13:
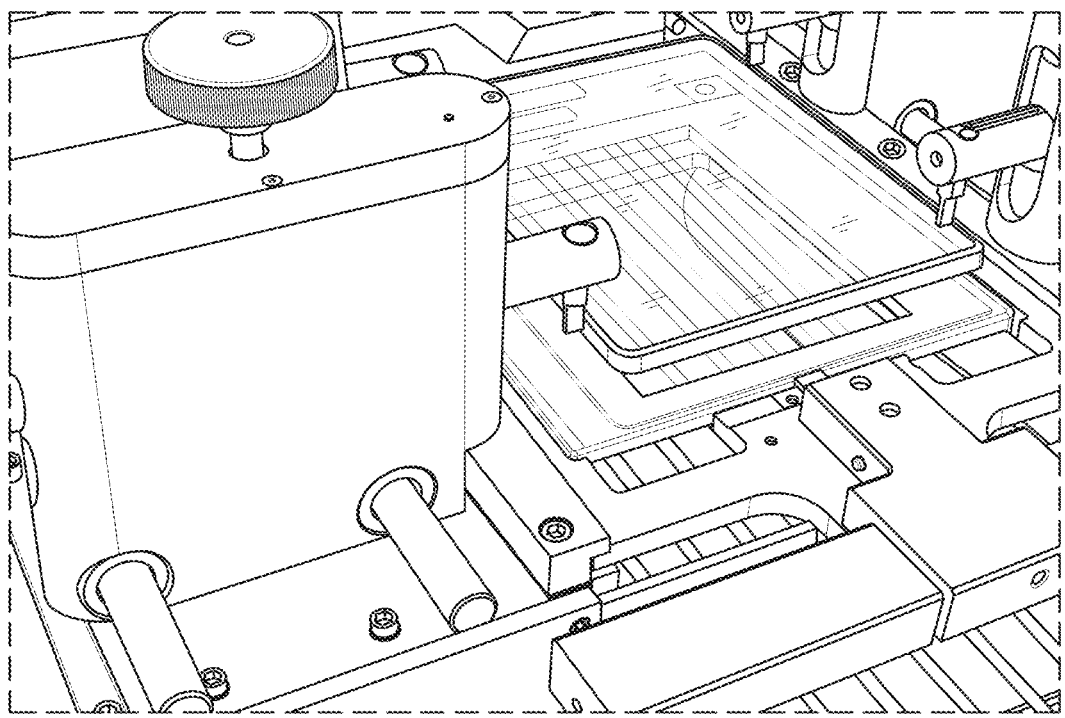

11.3.5 The upper left "up/down" knob on the pellicle removal tool was turned such that it raised the puller arm and continued to drive the adhesive tear toward the upper right most corner of the pellicle frame. Once the tear reached the 75% point to the other side, the last "up/down" knob in the upper right corner was turned to raise the frame until the frame separated from the mask surface (FIG. 13).

Figure 14:
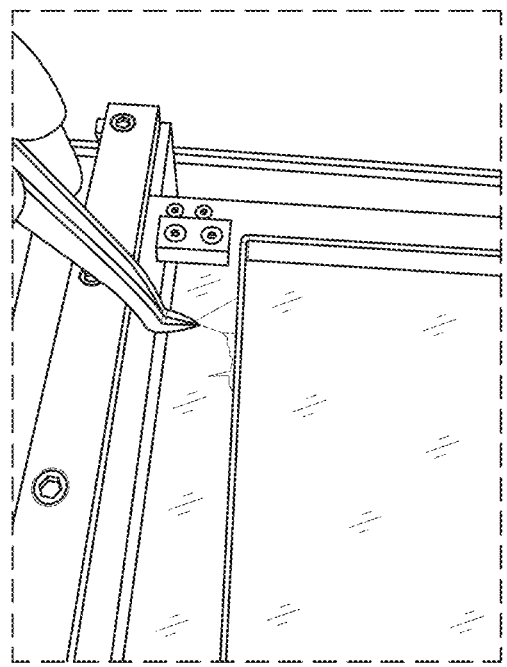

11.4 Removal of the Mask from the Pellicle Removal Tool 11.4.1 With both LED lighting systems on, the plate surface that the pellicle was adhered to was closely examined in order to make sure there was no glue strings present between the plate and the frame. If none existed, the cassette with the plate was removed and placed in the cassette holder. The rear chrome knob on the cassette was loosened all the way, the plate was removed with the mask handlers, and the plate was moved to the next process. If a "stringer" existed, the ESD-safe black tweezers were used to grab hold of the stringer such that it could be moved outward and grabbed by hand (FIG. 14). The stringer was pulled slowly until the glue string detached from the plate surface. If the glue string broke mid pull, the Glue Ball 1 (GB1) stringer remover tool was used (see para. 11.5).

11.5 Using the Glue Ball 1 glue stringer remover for plates that have residual glue after a pull 11.5.1 To use the GB1 glue stringer remover, the remover was retrieved from a storage box and the tip cover was removed but not discarded. The cover was removed from the tool by rotating the tool slightly while the cover was held.

11.5.2 After removal of the tip cover, a large ball of glue on the tip of the tweezers was observed. This glue is the same type as that of the pellicle frames.

11.5.3 The tip of the GB1 was pressed on the residual glue string that was on the plate. Once contact was made, the GB1 was lifted slowly so that the residual string pulled upward.

11.5.4 With the GB1 tool slightly lifted off the plate, it was turned in a circular motion slowly such that the glue string wrapped around the glue ball. Care was taken not to scratch the plate during residual removal. When complete, the glue was not removed from the GB1 removal tool. The tip cover was put back on the tool and the tool was placed back in the box.

Having described this invention with regard to specific embodiments, it is to be understood that the description is not meant as a limitation since further modifications and variations may be apparent or may suggest themselves to those skilled in the art. It is intended that the present application cover all such modifications and variations.

The invention claimed is:

1. A pellicle removal tool comprising:
(A) a stage that holds a photomask in a fixed position relative to an associated pellicle;
(B) two or more arms positioned around the stage and configured to engage pellicle side wells included on at least one side of the pellicle and configured to be lifted in a sequential order; and
(C) two or more actuators configured to:
(i) independently adjust at least a vertical position of a corresponding arm of the two or more arms, and (ii) lift the two or more arms in a sequential order from one arm to the next arm so as to apply a sequence of lifting forces around the pellicle with the stage holding the photomask in a fixed position for removal of the pellicle from the photomask, wherein each of the two or more actuators comprises:

a first actuator configured to provide a fine position adjustment of the corresponding arm, and a second actuator configured to provide a rough position adjustment of the corresponding arm, wherein the two or more arms are each housed in a corresponding column, each column being configured to be independently positioned along the at least one side of the pellicle that includes the pellicle side wells.

2. The pellicle removal tool of claim 1, wherein each of the two or more actuators comprises a first actuator that adjusts a vertical position of the corresponding arm and a second actuator that adjusts a lateral position of the corresponding arm.

3. The pellicle removal tool of claim 1, wherein each of the two or more actuators comprises a lead screw.

4. The pellicle removal tool of claim 1, wherein each of the two or more arms comprises a pin configured for engagement with the pellicle side wells.

5. The pellicle removal tool of claim 1, wherein each of the two or more columns is mounted on a linear motion bearing.

6. The pellicle removal tool of claim 5, wherein each of the linear motion bearings comprises a rail.

7. The pellicle removal tool of claim 1, wherein the stage comprises a plate holder into which the photomask is inserted.

8. The pellicle removal tool of claim 7, wherein the plate holder is removable from the tool.

9. The pellicle removal tool of claim 7, wherein the plate holder comprises a clamp mechanism that secures the photomask within the plate holder.

10. The pellicle removal tool of claim 9, wherein the clamp mechanism comprises an adjustable banking arm.

11. The pellicle removal tool of claim 7, wherein the plate holder comprises at least one of tabs or ramps that flexibly engage the photomask.

12. The pellicle removal tool of claim 1, further comprising one or more lighting elements.

* * * * *